(12) United States Patent
Hartmann et al.

(10) Patent No.: US 7,124,325 B2
(45) Date of Patent: Oct. 17, 2006

(54) METHOD AND APPARATUS FOR INTERNALLY TRIMMING OUTPUT DRIVERS AND TERMINATIONS IN SEMICONDUCTOR DEVICES

(75) Inventors: Udo Hartmann, Neuried (DE); Sascha Nerger, München (DE)

(73) Assignee: Infineon Technologies AG, Munich (DE)

( * ) Notice: Subject to any disclaimer, the term of this patent is extended or adjusted under 35 U.S.C. 154(b) by 544 days.

(21) Appl. No.: 10/680,782

(22) Filed: Oct. 7, 2003

(65) Prior Publication Data

US 2004/0066683 A1    Apr. 8, 2004

(30) Foreign Application Priority Data

Oct. 7, 2002 (DE) .............................. 102 46 741

(51) Int. Cl.
*G06F 11/00* (2006.01)
*G11C 5/00* (2006.01)

(52) U.S. Cl. ..................... 714/30; 365/189.09
(58) Field of Classification Search ............... 714/30, 714/32, 721; 365/189.09
See application file for complete search history.

(56) References Cited

U.S. PATENT DOCUMENTS 5,426,616 A * 6/1995 Kajigaya et al. ............. 365/226

6,184,720 B1 * 2/2001 Kim et al. ..................... 327/37
6,307,801 B1 * 10/2001 Ogawa et al. ............. 365/226
7,000,160 B1 * 2/2006 Tanaka et al. .............. 714/724
2003/0016566 A1 * 1/2003 Yamaki et al. ......... 365/189.09

FOREIGN PATENT DOCUMENTS

| DE | 37 83 963 T2 | 1/1988 |
| DE | 690 19 621 T2 | 1/1991 |
| EP | 0 254 011 B1 | 1/1988 |
| EP | 0 410 402 B1 | 1/1991 |

* cited by examiner

*Primary Examiner*—Nadeem Iqbal
(74) *Attorney, Agent, or Firm*—Laurence A. Greenberg; Werner H. Stemer; Ralph E. Locher

(57) ABSTRACT

To trim interface devices on semiconductor devices, such as trimmable output drivers and terminations, a measurement current produced in the test apparatus is impressed onto the interface device, and a measurement voltage produced by the measurement current in the interface device is detected by a trimming unit provided within the semiconductor device and is trimmed using control elements and trimming registers controlled by the trimming unit. To this end, the trimming unit ascertains trimming information which is stored in nonvolatile fashion in a memory unit in the semiconductor device and is loaded into the trimming registers in the semiconductor device whenever the semiconductor device is started up.

20 Claims, 3 Drawing Sheets

METHOD AND APPARATUS FOR INTERNALLY TRIMMING OUTPUT DRIVERS AND TERMINATIONS IN SEMICONDUCTOR DEVICES

BACKGROUND OF THE INVENTION

Field of the Invention

The invention relates to a method for trimming interface devices on semiconductor devices using a test apparatus having at least one current source. Each of the interface devices has a settable control element.

In data bus systems, data signals are transmitted between a plurality of semiconductor devices on data lines combined to form a common data bus. The power of the data bus system is characterized, inter alia, by a data transmission rate at which data are interchanged between the semiconductor devices within the data bus system.

An example of a data bus system with a high data transmission rate is the DDR (double data rate) II memory system for computer systems, such as PCs, workstations and servers. In this case, a system board for the DDR memory system is provided with slots for memory modules in the form of plug sockets, and these slots are fitted with a variable number of memory modules on the basis of the desired size of the main memory. The memory modules are normally in the form of DIMMs (dual inline memory modules) whose mechanical and electrical interfaces for the system board are subject to industrial standards. The memory modules hold DDRII-DRAMs (double data rate II-dynamic random access memories) as semiconductor memory devices. For DDRII memory systems, typical data transmission rates that are obtained to and from the DDRII-DRAMs are 333 Mbits per second and per data signal (Mbit/s/pin).

As data transmission rates increase on the data bus, the semiconductor devices effecting access for the purpose of writing to the data bus or reading from the data bus demand narrower tolerances for the interface parameters in order to maintain the integrity of the data signals transmitted to the data bus.

A first such interface parameter is the impedance of the output drivers (OCD-off chip driver), which a semiconductor device uses to effect a write access to the data bus, or to output data signals to the data bus. The impedance of an output driver influences the rise and fall times when there is a signal level change in the data signal driven by the output driver, and hence influences a signal delay in the data signal. A maximum skew in the signal delays of all of the output drivers in a semiconductor device or in all of the semiconductor devices in a data bus system limits a maximum data transmission rate. The smaller the maximum skew in this case, the higher the data transmission rates that can be implemented.

Another interface parameter is formed by terminations, which terminate the data bus locally in the semiconductor device in order to prevent reflections (ODT-on die termination). As the precision of the termination increases, interference signals arising at the location of the termination are attenuated to an increasing extent and a higher maximum data transmission rate is made possible in the data bus system.

The interface parameters of semiconductor devices are subject to production variations and vary both from semiconductor device to semiconductor device and within a semiconductor device, for example, from output driver to output driver. The interface parameters are also subject to variations over time during the operation of the semiconductor device. In this case, the variations over time result, by way of example, from any temperature dependency of the interface parameters or the latter's dependency on an operating voltage for the semiconductor device.

For operation in data bus systems with a high data transmission rate, provision is therefore made for the semiconductor device's interface parameters to be trimmed at least once before or during the initial startup of the semiconductor device or repeatedly during the operation of the semiconductor device. The trimming is performed by control elements in the respective interface devices. The control elements are in the form of switchable impedances whose respective value can be programmed on the basis of a register value in a trimming register (EMRS-extended mode register set).

For ordinary DDRII memory systems, it is normally not possible to trim the interface parameters of DDRII-DRAMs in a target system, since the DDRII-DRAMs cannot be addressed individually within the data bus system. However, selective addressing of individual DDRII-DRAMs is a necessary prerequisite for trimming the interface parameters.

For DDRII-DRAMs, it is therefore necessary to perform trimming in the course of testing the DDRII-DRAMs outside a target system on test apparatuses that are normally designed for conventional, untrimmable DRAMs or DDRII-DRAMs.

A DDRII-DRAM, which has interface devices to be trimmed, is trimmed on a conventional test apparatus by connecting a test output on the test apparatus to an interface connection on the semiconductor device. The test output is connected within the test apparatus to a first DC unit, operated as a current source, and to a further, second DC unit, operated as a voltmeter. As their control element, the interface devices have respective programmable resistors that each have the lowest possible value at the start of the trimming. The current source is used to impress a measurement current onto the interface device. A measurement voltage produced by the measurement current is compared in the test apparatus with a nominal voltage. While the measurement voltage is below the nominal voltage, the register value in the test piece's trimming register is incremented in stages, and the resultant newly obtained measurement voltage is respectively compared with the nominal voltage again. If the measurement voltage is above the nominal voltage, then the register value corresponding thereto is detected and is stored in a suitable manner for further use.

A drawback of this method is, in particular, the relatively low throughput of test pieces, which results from the limited number of DC units suitable for precise output and/or measurement of currents and voltages within test apparatuses designed for conventional DRAMs. Since equipping the test apparatuses with a large number of precise DC units, if at all possible, results in high costs, and testing conventional, untrimmable DRAMs does not require a large number of DC units, the number of the DC units is normally limited in relation to other system resources in the test apparatus.

Another drawback is the time required for evaluating measurement and trimming data, since the test apparatuses designed for digitally operating semiconductor devices normally have only limited resources available for determining, evaluating and calculating analog measured variables. This is because such resources are expensive.

In addition, test programs on the test apparatuses need to be prepared, implemented and continually aligned with the product lines.

Since, normally, contact needles are used to make contact with the semiconductor devices that are to be trimmed, a contact resistance between the contact needle and a contact area on the semiconductor device is also included in the measurement of the measurement voltage and may significantly corrupt the trimming.

SUMMARY OF THE INVENTION

It is accordingly an object of the invention to provide a semiconductor device and a method for trimming interface devices of the semiconductor device, which overcome the above-mentioned disadvantages of the prior art apparatus and methods of this general type.

In particular, it is an object of the invention to provide a method for trimming interface devices such as output drivers and terminations in semiconductor devices of a novel, trimmable type. Test apparatus designed for testing functionally comparable semiconductor devices of a conventional, untrimmable type, can be used to test the semiconductor devices of the trimmable type with high precision while achieving a throughput that is the same as that when testing semiconductor devices of the conventional type. It is also an object of the invention to provide a semiconductor device that supports the inventive method.

With the foregoing and other objects in view there is provided, in accordance with the invention, a method for trimming interface devices. The method includes the following steps: A semiconductor device having a plurality of interface devices is provided and each one of the plurality of interface devices is provided with a settable control element. A test apparatus having a current source is provided. The current source in the test apparatus is connected to an interface connection on the semiconductor device. The interface connection is connected to one of the plurality of interface devices. A measurement current produced by the current source is controlled and the control element of the one of the plurality of interface devices is set to an initial value. A trimming unit is provided in the semiconductor device. The trimming unit is used to acquire a measurement voltage produced by the measurement current in the one of the plurality of interface devices. The trimming unit is used to compare the measurement voltage with a nominal voltage. Based on a difference between the measurement voltage and the nominal voltage, the control element of the one of the plurality of interface devices is set to a trimming value at which the measurement voltage matches the nominal voltage. The trimming value for the control element of the one of the plurality of interface devices is acquired.

In line with the invention, the trimming unit is in this case provided within the semiconductor device. As a result, it is not necessary to provide two DC voltage units within the test apparatus for each semiconductor device of novel type that is to be trimmed. Since the test parallelism, that is to say a number of semiconductor devices which can be tested and trimmed simultaneously using a test apparatus designed for testing semiconductor devices of a comparable conventional type that cannot be trimmed or can be trimmed in a different way, is limited by the number of available DC voltage units, the test parallelism is doubled by the inventive method. A further increase in a throughput on the test apparatus is obtained by evaluating analog measurement data in the test apparatus, and needing to trigger controls on the basis thereof, to a significantly reduced extent.

The inventive method also makes it unnecessary to continually implement and update test programs in the test apparatus in order to test product lines of semiconductor devices. Creating and maintaining test programs determine a fundamental part of the test laboratory costs.

Finally, the inventive method makes it possible to provide measurement points for voltage measurement directly on the interface device, in a particularly advantageous manner. This prevents voltage drops, giving rise to measurement errors, in supply lines and on contact devices.

The invention also provides for the trimming value for the control element to be stored in nonvolatile fashion in the semiconductor device. This makes it possible to trim the semiconductor device in a test laboratory before being used in a target system.

Normally, trimmable semiconductor devices contain trimming registers. In the case of DDRII-DRAMs, these are the EMRS (extended mode register set). The control elements in the interface devices are connected to the trimming register and can be programmed on the basis of the value stored in the trimming register. Whenever the DDRII-DRAM has been started up, the invention provides for the trimming register to be loaded with the trimming value that has been stored in nonvolatile fashion.

Trimming is typically carried out by increasing a resistance value for a semiconductor section in stages, starting from a low initial value, until the trimming unit records a change of arithmetic sign for a difference between the measurement voltage and the nominal voltage.

In line with another advantageous exemplary embodiment of the inventive method, the trimming value is ascertained directly from the difference between the measurement voltage and the nominal voltage, as a result of which the time required for a trimming is reduced further.

Preferably, the inventive method provides for the semiconductor devices to be tested at the wafer level. Besides the usual advantages of testing at the wafer level, which enables the early identification of faulty semiconductor devices before performing further cost-intensive production steps, for example, packaging, it is also possible to provide at least parts of the trimming unit in the wafer's cut region (kerf) in a space-saving manner. The interface connections on the semiconductor devices are then arranged on a surface of the wafer and are produced in the form of contact areas.

The test apparatus is normally connected to the semiconductor device using contact needles that are provided in a needle board and are pressed onto the contact areas associated with the interface connections. Since conventional voltage measurement methods involve using a DC unit in the test apparatus, contact resistances resulting from pressing the contact needles onto the contact areas of the interface connections appear connected in series with the actual measurement voltage.

The contact resistance for each contact needle/contact area transition fluctuates in a range between 0 and 10 ohms. The resistance through the interface device in the trimmed state reaches values of 18 ohms for output driver devices. A measurement error is thus up to 55%. In addition, the contact resistance fluctuates in the indicated range, so that it is also not a simple matter to remove the measurement error by calculation. This problem does not arise in the case of the inventive method, since the measurement points are provided in the immediate vicinity of the interface device in the semiconductor device itself, and the measurement is likewise taken in the semiconductor device.

In line with a first embodiment of the inventive method, the control element is set or programmed in the course of the trimming by virtue of the trimming unit setting the trimming register, which achieves further load reduction for the test apparatus.

In line with another embodiment of the inventive method, the trimming register is set by the test apparatus in the course of the trimming, with the measurement result being transmitted to the test apparatus in a first step and the test apparatus writing to the trimming register on the basis of the transmitted measurement result in a second step.

Besides prescribing a loading value for the trimming register, the trimming value can be impressed onto the control element directly, for example, by laser-fuse or e-fuse devices. Thus, the trimming value for the control element is transmitted to the test apparatus preferably via a monitor output and is impressed in a nonvolatile fashion onto the control element by the test apparatus using laser or e-fuse devices.

In line with another preferred embodiment of the inventive method, the trimming value for the control element is impressed onto a loading register in the trimming register by the trimming unit in nonvolatile fashion. In this case, the loading register is a group of laser or e-fuse devices in the simplest case.

If the semiconductor devices are DRAMs having a DDRII interface, then the latter's output driver devices and terminations are particularly suitable as trimmable interface devices within the context of the invention. The output drivers normally need to be provided at low impedance, that is to say in the region below 100 ohms, as do the terminations. However, low-value resistances, in particular, can be provided only inaccurately in semiconductor devices using the means and processes that are customary in semiconductor process technology. Since low-value contact resistances in the order of magnitude of the variable that is to be trimmed arise in conventional methods, however, the inventive method is particularly advantageous for this application.

With particular preference, the current source, which is provided and operated in a current-limited fashion for the purpose of trimming, is an output driver in the test apparatus. This output driver is provided for the purpose of driving digital signals. The measurement current is then obtained from the value of the current limitation. Since, besides a voltage supply for the semiconductor devices, no other DC unit is then necessary in the test apparatus for the trimming. The number of DC units, as the factor which limits the test parallelism and hence the test throughput, is accordingly reduced. As compared with testing semiconductor devices of a conventional type, essentially the same throughput is also obtained for semiconductor devices of the novel, trimmable type when using the test apparatuses designed for testing semiconductor devices of the conventional type.

A prerequisite of the inventive method is providing a semiconductor device including: at least one interface device having a settable control element, and a trimming register connected to the control element. In addition, the semiconductor device has a trimming unit connected to the interface device and to the trimming register and writes to the trimming register on the basis of a measured variable detected on the interface device.

Preferably, the inventive semiconductor device has a monitor output. The monitor output is used to transmit a measured variable, for example, in digital form or via a data bus in the semiconductor device, and/or a trimming value, ascertained by the trimming unit, for the control element to a test apparatus.

In addition, the trimming unit has a reference voltage device and a voltage divider for producing a nominal voltage. Since the voltage divider's ratio is set using dimensions that are relatively easy to control using devices and processes which are customary in semiconductor process technology, no additional trimming is necessary for the internal reference voltage circuit.

In addition, the trimming unit has: a comparator unit, which compares the nominal voltage with a measurement voltage produced in the interface device, and a logic unit which is suitable for writing to the trimming register on the basis of an output signal from the comparator unit.

A nonvolatile memory unit that can be programmed on the basis of a trimming value can be used to control the trimming process completely from the trimming unit arranged on the semiconductor device and without any other control via the test apparatus.

In this case, in line with a first embodiment of the inventive semiconductor device, the memory unit is suitable for directly controlling the control element.

In line with an alternate embodiment of the inventive semiconductor device, the memory unit is suitable for loading the trimming register. In this case, for every startup, the trimming register is loaded with the value stored in the memory unit and then controls the associated control element in a conventional manner.

Other features which are considered as characteristic for the invention are set forth in the appended claims.

Although the invention is illustrated and described herein as embodied in a method and apparatus for internally trimming output drivers and terminations in semiconductor devices, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
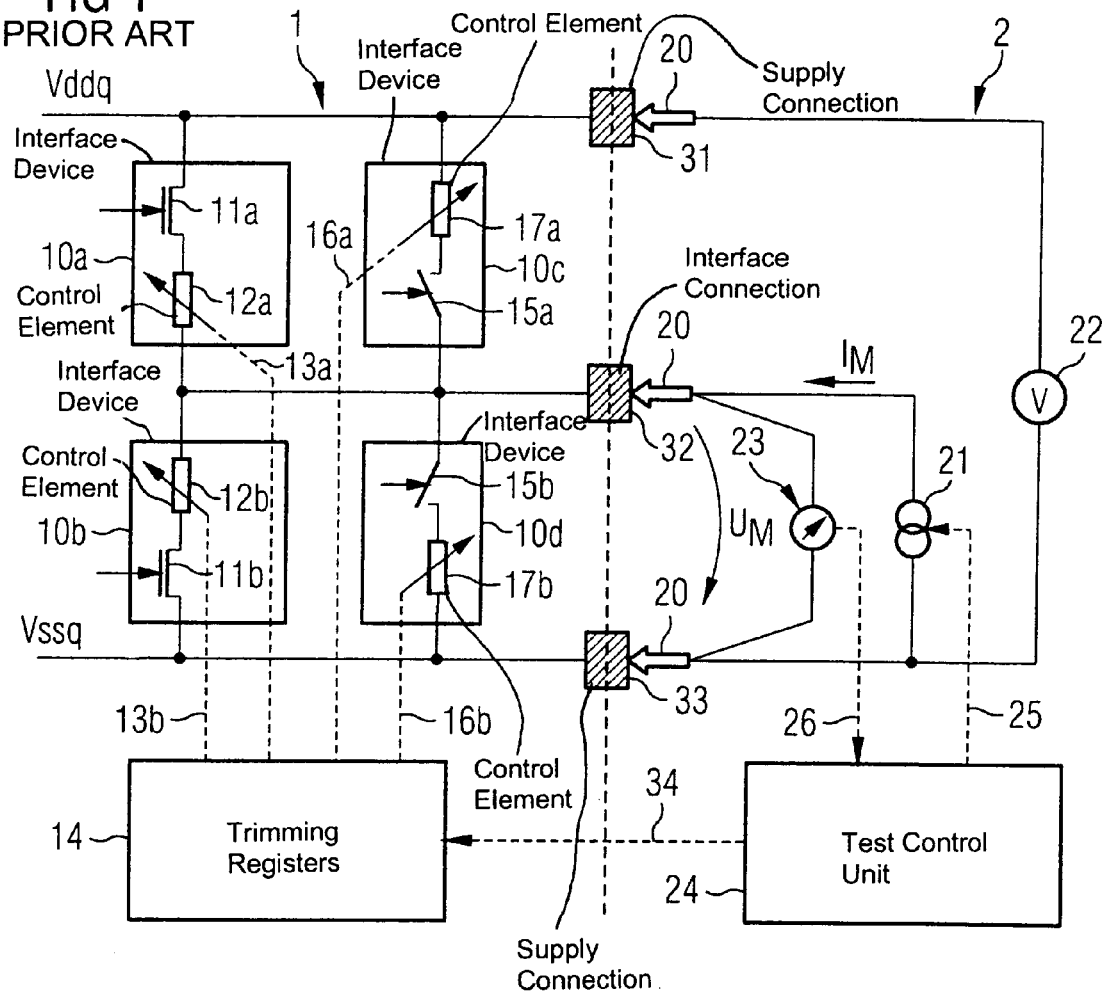
FIG. 1 is a schematic diagram of a configuration for performing a prior art method for trimming interface devices in a semiconductor device.

Referring now to the figures of the drawing in detail and first, particularly, to FIG. 1 thereof, there is shown the components of a trimmable semiconductor device 1 and of a test apparatus 2 which are relevant for explaining a conventional method for trimming interface devices 10. The semiconductor device 1 has supply connections 31, 33 and interface connections 32, of which only the supply connections 31 and 33 for supplying potentials Vddq and Vssq and the interface connection 32 of a driver apparatus for a DDRII-DRAM are shown in order to simplify matters.

The driver apparatus includes four interface devices 10a–10d. Two of the interface devices are output driver devices 10a, 10b. The two other interface devices are termination devices 10c, 10d. The output driver devices 10a, 10b are made up of an ideal MOS transistor 11a, 11b and a control element 12a, 12b for an output impedance in the output driver device 10a, 10b. The output driver devices 10a, 10b are simplified to enable a simplified consideration. The termination devices 10c, 10d respectively include an ideal controllable switching device 15a, 15b and a control element 17a, 17b formed as a trimmable termination resistor. In addition, the semiconductor device 1 has a trimming register or a set of trimming registers 14 which are each connected, via control paths 13a, 13b, 16a, 16b, to the control elements 12a, 12b, 17a, 17b of the respectively corresponding interface devices 10a–10d.

Besides a DC voltage source 22, the test apparatus 2 has a current source 21 and a voltmeter 23, which are each connected via a control path 25 and via a data path 26 to a test control unit 24 in the test apparatus 2.

For the purpose of trimming the interface devices 10a–10d, the DC voltage source 22, the current source 21 and the voltmeter 23 are connected to the semiconductor device 1 via the supply connections 31, 33 and the interface connection 32.

The control elements 12, 17 in the semiconductor device 1 are set according to an initial value, and one of the interface devices 10a–10d is connected through. The current source 21 is used to impress a measurement current $I_M$ of known intensity onto the interface connection 32. A measurement voltage $U_M$ obtained between the interface connection 32 and one of the supply connections 31, 33 is measured using the voltmeter 23 and is transmitted to the test control unit 24.

If the ascertained measurement voltage $U_M$ differs from a nominal value $U_S$ too greatly, then the test control unit 24 uses a control path 34 to increment the value of a corresponding trimming register 14 in stages. The value in the trimming register 14 is taken as a basis for altering the control elements 12, 17, for example, by increasing an impedance in stages. If an admissible value is recorded for the measurement voltage $U_M$, then the current trimming value for the control elements 12, 17 which is stored in the corresponding trimming register 14 is detected. Using the trimming value, the test apparatus 2 subsequently programs a nonvolatile memory unit in the semiconductor device 1 in a known manner.

Figure 2:
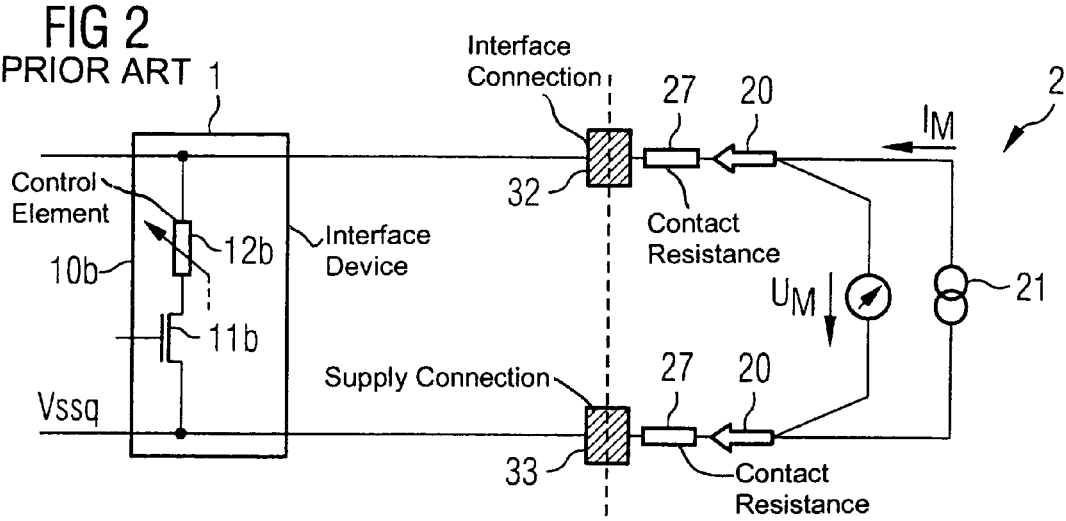
FIG. 2 is a schematic diagram of a detail from FIG. 1.

FIG. 2 shows a detail from FIG. 1. The test apparatus 2 is normally connected to the semiconductor device 1 using contact needles 20, which are pressed onto supply and interface connections 31–33 on the semiconductor device 1. The supply and interface connections 31–33 are in the form of contact areas. Contact resistances 27 of up to several ohms act on the transitions between the contact needles 20 and the supply and interface connections 31–33. In the case of a voltage measurement with the voltmeter 23, the voltage drop across the contact resistances is added to the voltage drop across the impedance that will be trimmed in the interface device 10, so that the impedance is incorrectly trimmed with an error of up to 55%. By contrast, present specifications for DDRII-DRAMs require trimming to approximately ±16%.

Figure 3:
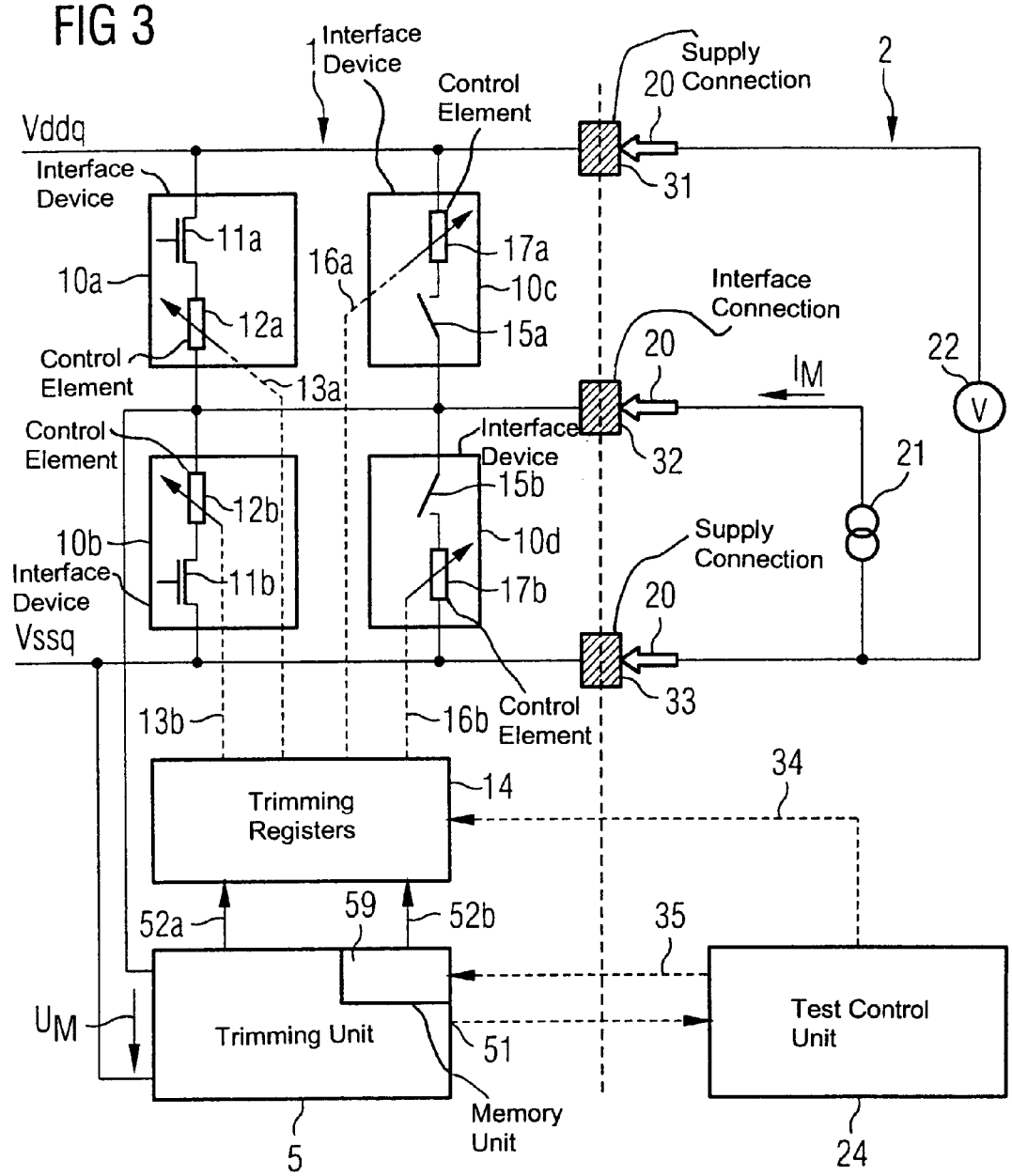
FIG. 3 is a schematic diagram of a configuration for trimming interface devices in a semiconductor device.

FIG. 3 is a schematic diagram showing a configuration for performing an inventive method for trimming interface devices 10 in an inventive semiconductor device 1. In this case, the inventive semiconductor device 1 has a trimming unit 5, in contrast to the conventional semiconductor device 1 shown in FIG. 1. The trimming unit 5 is switchably connected to each driver device which is to be trimmed in the semiconductor device 1. To preserve the clarity of the illustration, only the connection between the trimming unit 5 and one of the driver devices is shown. In line with an alternative solution, each driver device to be trimmed is assigned a trimming unit 5.

The trimming unit 5 is connected within the semiconductor device 1 to the interface devices 10a–10d in the driver device. Register paths 52a, 52b can be used by the trimming unit 5 to control a respective corresponding trimming register 14. Optionally, the trimming unit 5 is connected to the test control unit 24 in the test apparatus 2 via a monitor output 51, and the test apparatus 2 is connected to the corresponding trimming register 14 via the control path 34.

One of the interface devices 10a–10d is now trimmed by taking the measurement voltage $U_M$ as a basis for increasing the value of the corresponding trimming register 14, starting from a low initial value, via the register path 52a until a tolerable discrepancy between the measurement voltage $U_M$ and a nominal voltage $U_S$ is detected. The register value, required for this measurement voltage $U_M$, in the trimming register 14 is stored by the trimming unit 5 in a nonvolatile memory unit 59, for example using a soft-setting device in connection with electronic fuses or using EEPROM (electrically erasable programmable read only memory) cells.

The trimming of one of the interface devices 10a–10d is thus complete. Whenever the semiconductor device 1 is subsequently started up in a target system, the trimming value stored in the nonvolatile memory unit 59 is loaded into the respective corresponding trimming register 14, which accordingly sets the control elements 12, 17 in the associated interface devices 10a–10d.

Alternatively, it is also possible to transmit the trimming value to the test control unit 24 in the test apparatus 2 in a first step via the monitor output 51 or via a data bus system in the semiconductor device 1. In a second step, programming of the nonvolatile memory unit 59, for example, programming e-fuses, is controlled using a programming path 35. On the basis of a further alternative, laser fuses are set and erased by laser beam using an external programming apparatus.

Figure 4:
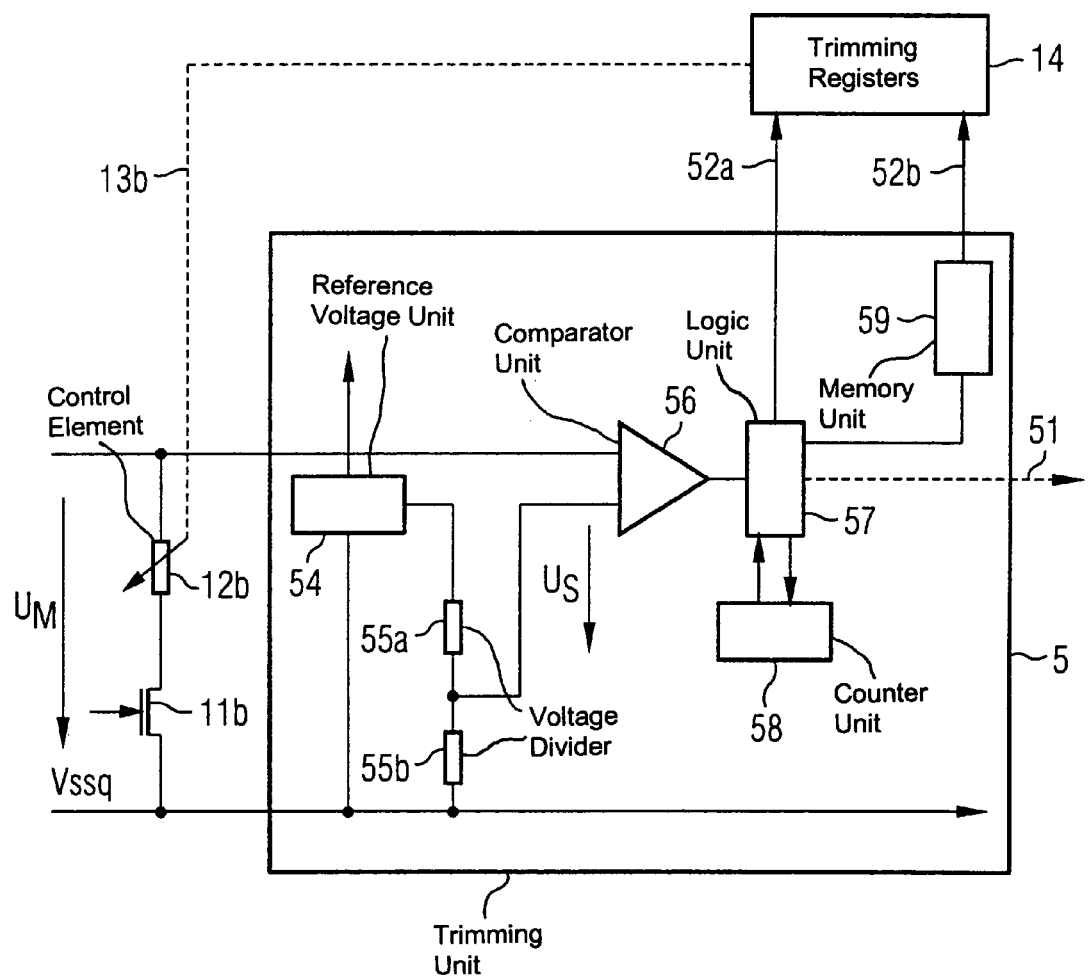
FIG. 4 is a schematic diagram of a detail from FIG. 3.

FIG. 4 shows fundamental components of the trimming unit 5. An internal reference voltage unit 54, for example a bandgap reference, and a downstream voltage divider 55a, 55b are used to produce a nominal voltage $U_S$. Since a ratio for the two resistance values in the voltage divider 55a, 55b is set using the processes and means customary in semiconductor process technology by using easily controllable dimensions, there is no need to trim the voltage divider 55a, 55b. As a reference voltage unit 54, it is also possible to use one which has already been provided in the semiconductor device 1 for other reasons. The comparator unit 56 is used to compare the measurement voltage $U_M$ with the nominal voltage $U_S$. On the basis of an output signal from the comparator unit 56, either a register value is increased in a counter unit 58 and is written to one of the trimming registers 14 via the register path 52, or the instantaneous register value corresponding to the value of the respective associated trimming register 14 in the counter unit 58 is written to the nonvolatile memory unit 59. A logic unit 57 is provided for writing to the trimming registers 14 on the basis of an output signal from the comparator unit 56.

Whenever the semiconductor device 1 is subsequently started up, the trimming registers 14 are respectively loaded with the corresponding trimming values stored in the nonvolatile memory unit 59, and the control elements 12, 17 are set on the basis of the associated trimming values.

We claim:

1. A method for trimming interface devices, which comprises:

providing a semiconductor device having a plurality of interface devices and providing each one of the plurality of interface devices with a settable control element;

providing a test apparatus having a current source;

connecting the current source in the test apparatus to an interface connection on the semiconductor device, the interface connection being connected to one of the plurality of interface devices;

controlling a measurement current produced by the current source and setting the control element of the one of the plurality of interface devices to an initial value;

providing a trimming unit in the semiconductor device;

using the trimming unit to acquire a measurement voltage produced by the measurement current in the one of the plurality of interface devices;

using the trimming unit to compare the measurement voltage with a nominal voltage;

based on a difference between the measurement voltage and the nominal voltage, setting the control element of the one of the plurality of interface devices to a trimming value at which the measurement voltage matches the nominal voltage; and acquiring the trimming value for the control element of the one of the plurality of interface devices.

2. The method according to claim 1, which further comprises:

storing the trimming value for the control element of the one of the plurality of interface devices in the semiconductor device in a nonvolatile manner.

3. The method according to claim 2, which further comprises:

when the semiconductor device is started up, reading the trimming value stored in the semiconductor device into a trimming register controlling the control element of the one of the plurality of interface devices.

4. The method according to claim 2, which further comprises:

during trimming, setting the control element of the one of the plurality of interface devices by setting a trimming register with the trimming unit.

5. The method according to claim 2, which further comprises:

transmitting a result obtained from comparing the measurement voltage and the nominal voltage to the test apparatus via a monitor output; and during trimming, setting the control element of the one of the plurality of interface devices by writing, from the test apparatus, to a trimming register.

6. The method according to claim 2, which further comprises:

transmitting the trimming value for the control element of the one of the plurality of interface devices to the test apparatus and impressing the trimming value onto the control element of the one of the plurality of interface devices in a nonvolatile manner using the test apparatus or a further programming apparatus.

7. The method according to claim 2, which further comprises:

using the trimming unit to impress the trimming value for the control element of the one of the plurality of interface devices into a loading register in a trimming register.

8. The method according to claim 1 which further comprises:

starting from an initial value, unidirectionally setting the control element of the one of the plurality of interface devices in stages until the trimming unit records a change of an arithmetic sign for a difference between the measurement voltage and the nominal voltage.

9. The method according to claim 1, which further comprises:

providing the semiconductor device in a wafer; and producing a plurality of interface connections for the semiconductor device as contact areas configured on a surface of the wafer.

10. The method according to claim 9, which further comprises:

connecting the test apparatus to the semiconductor device by pressing a plurality of contact needles onto the contact areas.

11. The method according to claim 1, which further comprises: providing the semiconductor device as a DRAM having a DDRII interface.

12. The method according to claim 1, which further comprises:

providing each one of the plurality of interface devices as a device selected from a group consisting of an output driver interface and a termination.

13. The method according to claim 1, which further comprises:

providing the current source as an output driver operated in a current-limited manner for driving digital signals.

14. A semiconductor device comprising:

at least one interface device having a settable control element;

a trimming register connected to said control element; and a trimming unit for writing to said trimming register based on a measured variable detected on said interface device;

said trimming unit connected to said interface device and said trimming register.

15. The semiconductor device according to claim 14, further comprising:

a monitor output for transmitting a value for said control element to a test apparatus;

said value being a measured variable and/or a trimming value; and said value being ascertained by said trimming unit.

16. The semiconductor device according to claim 14, wherein said trimming unit includes a reference voltage device and a voltage divider for producing a nominal voltage.

17. The semiconductor device according to claim 14, wherein:

said trimming unit has a comparator unit for providing an output signal obtained by comparing a nominal voltage with a measurement voltage produced in said interface device; and said trimming unit has a logic unit for writing to said trimming register based on said output signal from said comparator unit.

18. The semiconductor device according to claim 14, wherein:

said trimming unit has a nonvolatile memory unit being programmed based on a trimming value.

19. The semiconductor device according to claim 18, wherein: said memory unit is configured for directly controlling said control element.

20. The semiconductor device according to claim 18, wherein:

said memory unit is configured for loading said trimming register.

* * * * *